US006001732A

United States Patent [19]
Hsu

[11] Patent Number: 6,001,732
[45] Date of Patent: Dec. 14, 1999

[54] METHOD OF FABRICATING A METAL WIRING LINE

[75] Inventor: Chen-Chung Hsu, Taichung, Taiwan

[73] Assignee: United Microelectronics Corp., Hsinchu, Taiwan

[21] Appl. No.: 08/941,082

[22] Filed: Sep. 30, 1997

[30] Foreign Application Priority Data

Jul. 16, 1997 [TW] Taiwan ................................. 86110057

[51] Int. Cl.$^6$ .................................................. H01L 21/28
[52] U.S. Cl. .......................... 438/633; 438/637; 438/645; 438/672
[58] Field of Search ..................................... 438/645, 633, 438/637, 672, FOR 355

[56] References Cited

U.S. PATENT DOCUMENTS 5,893,749 4/1999 Matumoto .

OTHER PUBLICATIONS

Wolf et al, "Silicon Processing, Process Technology", Lattice Press, 1986, p. 183.

*Primary Examiner*—George Fourson
*Assistant Examiner*—Joannie Garcia
*Attorney, Agent, or Firm*—Rabin & Champagne, P.C.

[57] ABSTRACT

A method of fabricating a metal wiring line includes providing a semiconductor substrate having a region desired for connecting with the metal wiring line, wherein a first dielectric layer is formed to cover the semiconductor substrate and a plurality of substantially parallel oxide pillars are formed on the first dielectric layer. The metal wiring line is then formed to contact the desired connecting region, and a second metal layer is then formed to contact the metal wiring line.

16 Claims, 5 Drawing Sheets

METHOD OF FABRICATING A METAL WIRING LINE

BACKGROUND OF THE INVENTION

1. Field of the Invention

The invention relates in general to the fabrication of semiconductor integrated circuits (ICs), and more particularly to the metalization process of ICs.

2. Description of the Related Art

In the manufacture of the IC, metal wiring lines are typically used to the electrical connection of devices. Therefore, to form the pattern of the metal wiring lines precisely is one of the crucial qualifications of IC quality. However, the conventional method for metalization tends to cause to problem of incomplete insulation, which directly reduces the yield of the product. Moreover, this problem becomes even more serious for devices of smaller size. To clearly explain the above-mentioned problems, the conventional metalization process is illustrated in FIG. 1A to 1C.

First, referring to FIG. 1A, a semiconductor substrate 10 is provided with a region 11 desired for forming metal wiring lines. The region 11 can be, for example, source/drain regions. This semiconductor substrate 10 is covered with a first dielectric layer 12 but the region 11 is exposed, and on the first dielectric layer 12, parallel oxide pillars 14 are formed. A first metal layer 15 is then formed by sputtering to cover the first dielectric layer 12 and the oxide pillars 14 and to contact the region 11. Next, chemical mechanical polishing (CMP) has been utilized to polish the first metal layer 15 to the same level as the oxide pillars 14.

Referring next to FIG. 1B, a second dielectric layer 16 is formed to cover the first metal layer 15 and the oxide pillars 14. Then, the second dielectric layer 16 is defined to form via holes. After tungsten is deposited into the via hole, etching back and CMP are performed to form a metal wiring line 17.

Referring now to FIG. 1C, a metal layer is sputtered over the second dielectric layer 16 to contact with the metal wiring line 17; after patterned, a second metal layer 18 is formed.

The conventional method includes the process of forming a tungsten plug. Therefore, the steps of tungsten deposition and etching back or CMP are essential for the conventional method. However, theses steps are complicated and costly. Moreover, opening a via hole may result in misalignment and incomplete opening.

SUMMARY OF THE INVENTION

It is therefore an object of the invention to provide a process for fabricating a metal wiring line for integrated circuits that overcomes the above mentioned problems.

The invention achieves the above-identified objects by providing a new method of fabricating a metal wiring line, comprising the steps of: first, a semiconductor substrate, having a region desired for connecting with the metal wiring line is provided, wherein a first dielectric layer is formed to cover the semiconductor substrate and a plurality of substantially parallel oxide pillars are formed on the first dielectric layer; second, the metal wiring line is formed to contact the region desired for contacting the metal wiring line; and third, a second metal layer is formed to contact the metal wiring line.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Embodiment 1

Figure 1A:
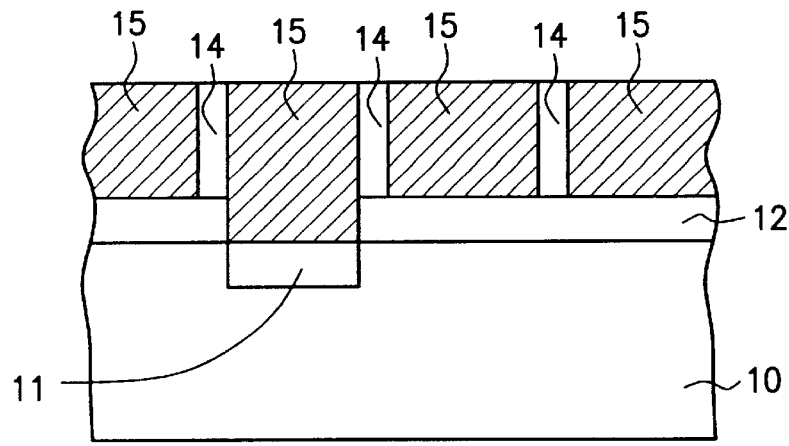
FIGS. 1A to 1C (Prior Art) are cross-sectional views showing a conventional process of fabricating a metal wiring line.
Figure 1B:
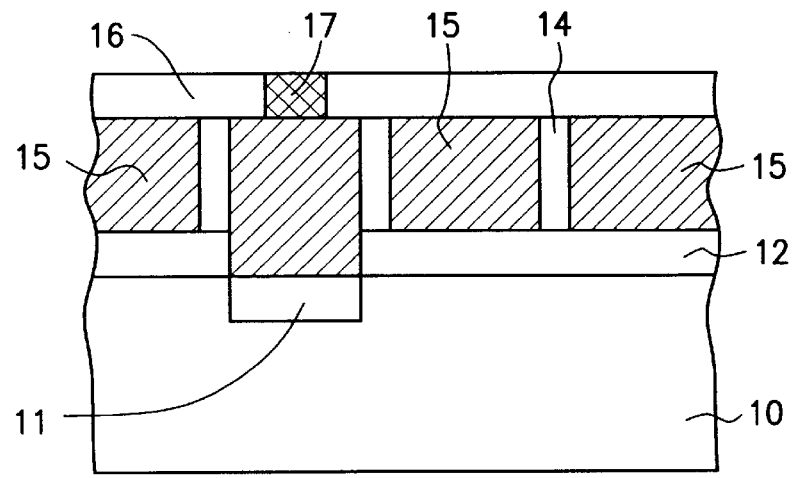
Figure 1C:
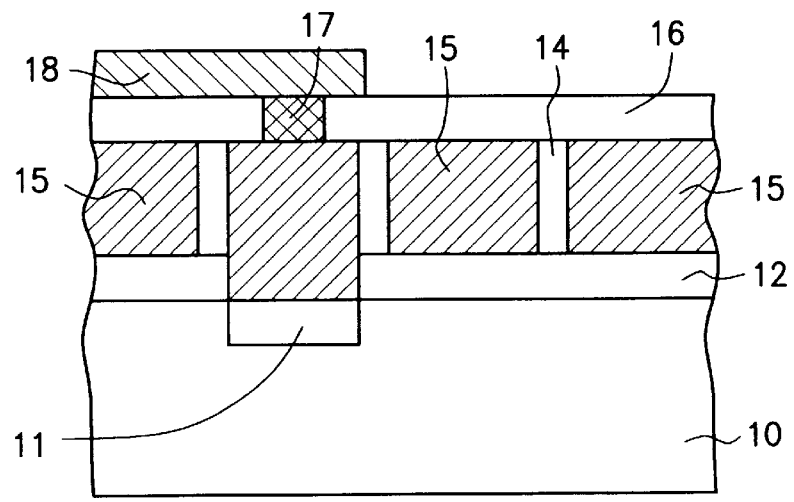
Figure 2A:
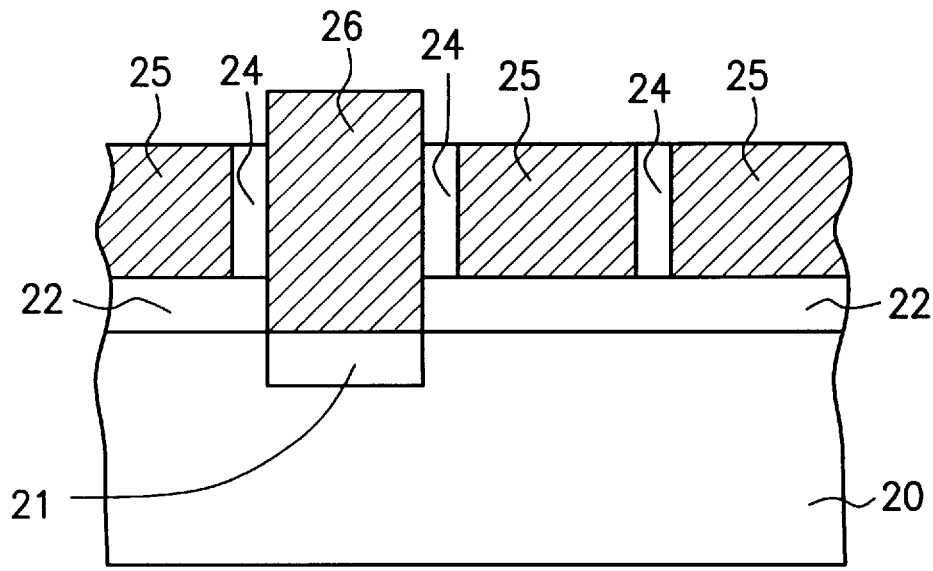
FIGS. 2A to 2C are cross-sectional views showing the process steps of the first preferred embodiment of the method for fabricating a metal wiring line according to the invention.

Referring first to FIG. 2A, a semiconductor substrate 20 is provided with at least a region 21 desired for interconnection, which can be, for example, a source/drain region. The semiconductor substrate is covered with a first dielectric layer 22, exposing the region 21. Substantially parallel oxide pillars 24 are formed on the first dielectric layer 22. A metal layer is sputtered to cover the first dielectric layer 22 and the oxide pillars 24 and contact the region 21. Then, the surface of the metal layer is polished by CMP. The metal layer is patterned by a conventional via hole mask to form at least a metal wiring line 26 and metal pillars 25, so that the metal wiring lines 26 are at a level substantially higher than that of the oxide pillars 24, and the metal pillars 25 are at a level substantially the same as the oxide pillars 24. The beetle structure of the metal wiring line 26 takes the place of the conventional tungsten plug.

Figure 2B:
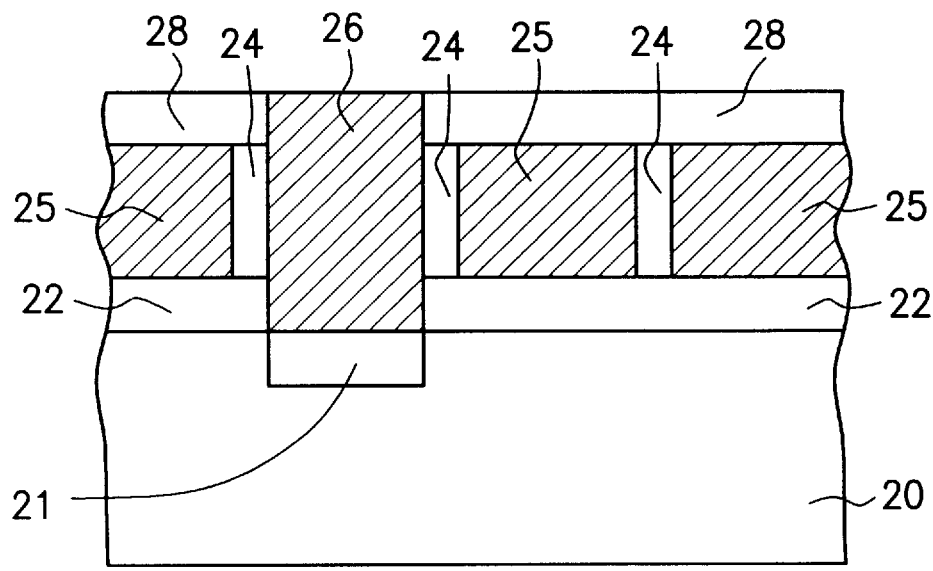

Referring to FIG. 2B, a second dielectric layer 28 is deposited to cover the metal pillars 25 and the oxide pillars 24 but expose the metal wiring lines 26. The second dielectric layer 28 can be formed by depositing TEOS, using plasma enhanced chemical vapor deposition (PECVD). CMP is then utilized to polish the surface of the second dielectric layer 28 until the levels of the dielectric layer 28 and the metal wiring line 26 are at substantially equal levels also to expose only the metal wiring line 26. Consequently, the region 21 can be connected to any wiring line through metal wiring line 26.

Figure 2C:
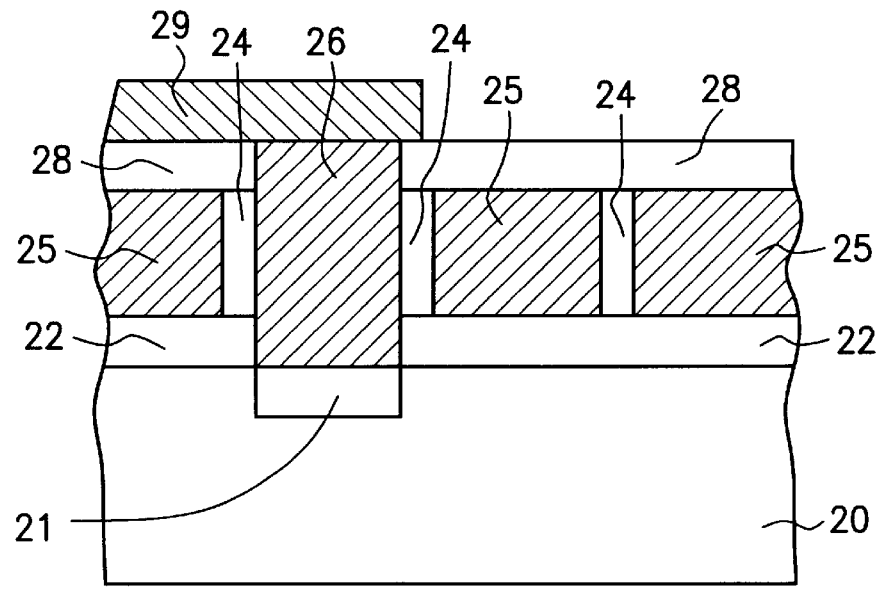
Figure 2D:
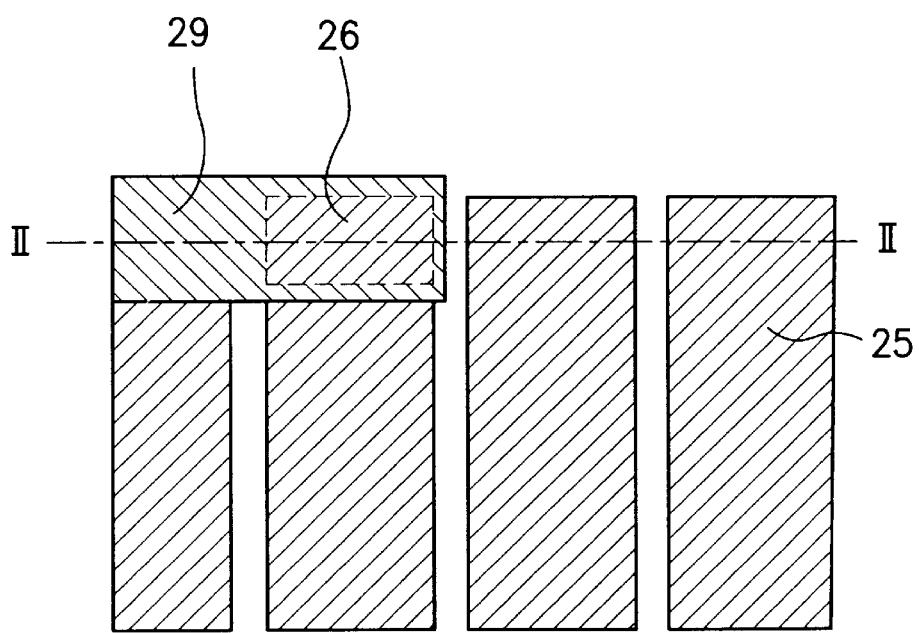
FIG. 2D is the top view of FIG. 2C.

Referring to FIG. 2C, a metal layer 29 is formed, preferably by sputtering, to cover the metal wiring line 26 and the second dielectric layer 28 so that the metal layer 29 can be coupled to the metal wiring line 26. The metal layer is then patterned to form a second metal layer 29. FIG. 2D is the top view and FIG. 2C is the cross-sectional view along the dotted line 11—11 of FIG. 2D.

Embodiment 2

Figure 3A:
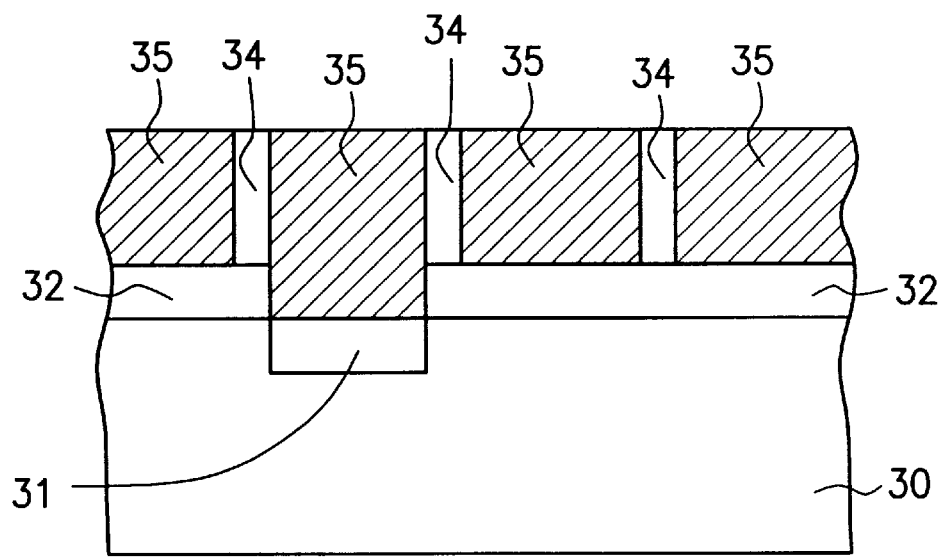
FIGS. 3A to 3D are cross-sectional views showing the process steps of the second preferred embodiment of the method for fabricating a metal wiring line.

Referring first to FIG. 3A, a semiconductor substrate 30 is provided with at least a region 31 desired for interconnection, which can be, for example, a source/drain region. The semiconductor substrate 30 is covered with a first dielectric layer 32, exposing the region 31. Substantially parallel oxide pillars 34 are formed on the first dielectric layer 32. A first metal layer 35 is sputtered to cover the first dielectric layer 32 and the oxide pillars 34 and to contact the region 31. Then, the surface of the first metal layer 35 is polished by CMP until layer 35 and pillars 34 and at substantially equal levels. The cross-sectional structure after CMP is as shown in FIG. 3A.

Figure 3B:
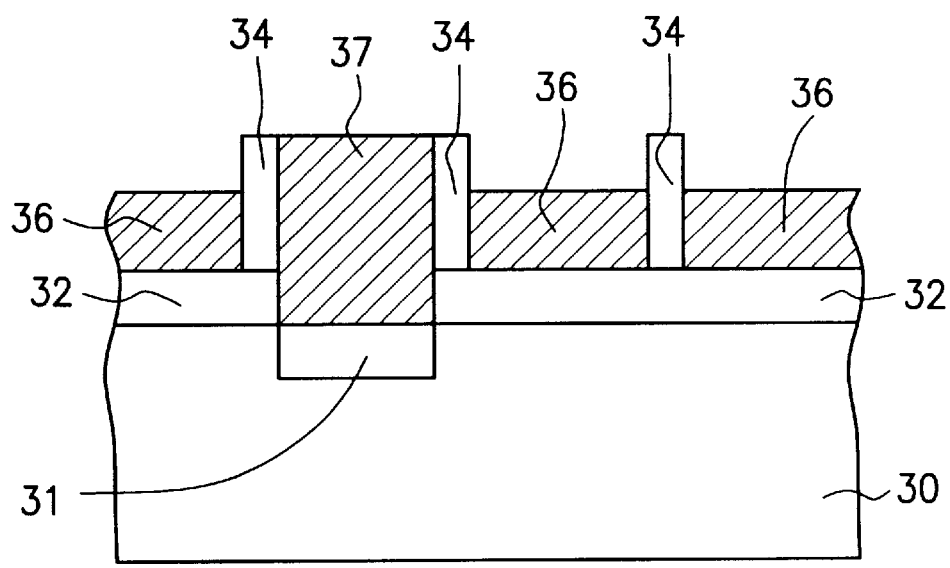

Referring to FIG. 3B, the first metal layer 35 is patterned, using a conventional photoresist mask for forming via holes, to form a metal wiring line 37 which has an equivalent function to that of the conventional via plug, and metal pillars 36 having a thickness of about 10000 Å.

Figure 3C:
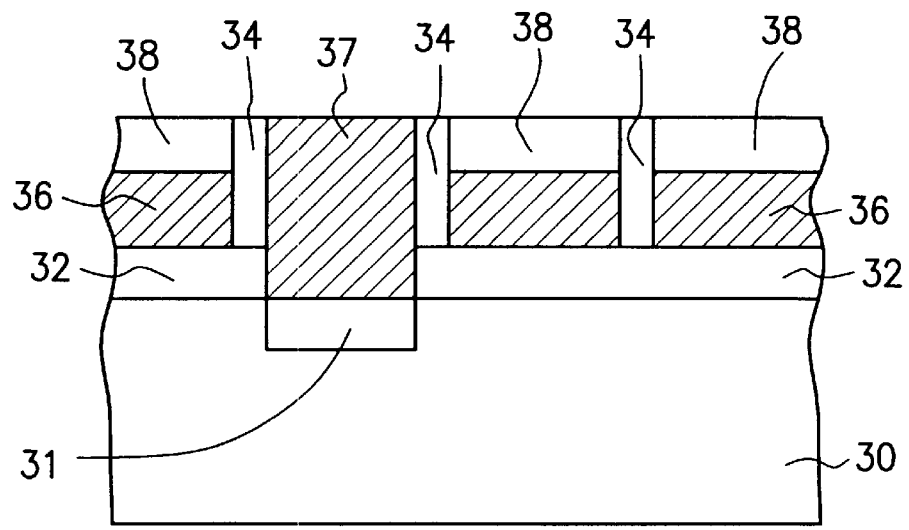

Referring to FIG. 3C, a second dielectric layer 38 is deposited to cover the metal wiring line 37 and the metal pillars 36. The method of forming the second dielectric layer 38 preferably including the steps of: first, depositing TEOS over the substrate by plasma enhanced chemical vapor deposition, then, polishing the second dielectric layer 38 to expose the metal wiring line 37 by CMP until the second dielectric layer has the same level as the metal wiring line 37.

Figure 3D:
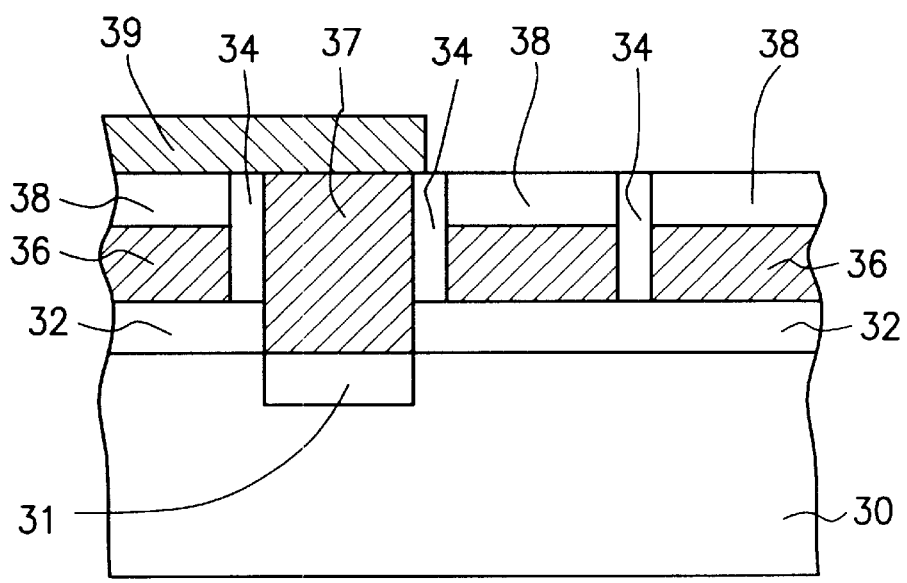

Referring to FIG. 3D, a metal layer is sputtered to cover the metal wiring line 37, the oxide pillars 34, and the second dielectric layer 38, so that this metal layer is able to contact with the metal wiring line 37. Then, this metal layer is patterned to form a second metal layer 39.

One of the objects of the invention is the metal wiring line 37 formed from the first metal layer 35 directly in contact with the region 31. Therefore, the processes of fabricating a via hole, depositing a tungsten plug, and etching back are eliminated. The whole process is consequently simplified and the cost is reduced.

Another object of the invention is that the structure is simplified.

An object of the invention is that the misalignment margin of the metal wiring line is bigger than the conventional via hole.

While the invention has been described by way of example and terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a metal wiring line of integrated circuits, comprising the steps of:

providing a semiconductor substrate, having a region desired for connecting with the metal wiring line, wherein a first dielectric layer is formed to cover the semiconductor substrate and a plurality of substantially parallel oxide pillars are formed on the first dielectric layer;

forming a first metal layer to contact with the desired region and to cover the first dielectric layer and the oxide pillars;

patterning the first metal layer, using a mask for forming a via hole, to form the metal wiring line and a plurality of metal pillars, wherein the metal wiring line is at a level higher than the level of the oxide pillars and the metal pillars;

forming a second dielectric layer to cover the metal pillars and the oxide pillars but expose the metal wiring line; and forming a second metal layer on the second dielectric layer to contact with the metal wiring line.

2. A method of fabricating a metal wiring line of integrated circuits as claimed in claim 1, wherein after said step of forming the first metal layer and before said step of patterning the first metal layer, the first metal layer is further processed through polishing, using chemical mechanical polishing.

3. A method of fabricating a metal wiring line of integrated circuits as claimed in claim 1, wherein the first metal layer is formed, using sputtering.

4. A method of fabricating a metal wiring line of integrated circuits as claimed in claim 1, wherein the first dielectric layer includes TEOS.

5. A method of fabricating a metal wiring line of integrated circuits as claimed in claim 1, wherein the second dielectric layer is formed by plasma enhanced chemical vapor deposition.

6. A method of fabricating a metal wiring line of integrated circuits as claimed in claim 1, wherein the second dielectric layer includes TEOS.

7. A method of fabricating a metal writing line of integrated circuits, comprising the steps of:

providing a semiconductor substrate having a connecting region desired for connecting with the metal wiring line;

forming a first dielectric layer covering the semiconductor substrate;

forming a plurality of substantially parallel oxide pillars on the first dielectric layer;

forming a first metal layer in contact with the connecting region and covering the first dielectric layer and the oxide pillars;

patterning the first metal using a via hole-forming mask, to form the metal wiring line and a plurality of metal pillars such that the metal wiring line is at a level higher than the levels of the metal pillars and at about the same level as a level of the oxide pillars; and forming a second metal layer that contacts the metal wiring line.

8. The method of fabricating a metal wiring line of integrated circuits as claimed in claim 7, further comprising the step of chemical mechanical polishing the first metal layer, after the step of forming the first metal layer but before the step of patterning the first metal layer.

9. A method of fabricating a metal wiring line of integrated circuits as claimed in claim 7, wherein the first metal layer is formed using sputtering.

10. A method of fabricating a metal wiring line of integrated circuits as claimed in claim 7, wherein the first dielectric layer includes TEOS.

11. A method of fabricating a metal writing line of integrated circuits, comprising the steps of:

providing a semiconductor substrate having a connecting region desired for connecting with the metal wiring line, wherein a first dielectric layer is formed covering the semiconductor substrate and a plurality of substantially parallel oxide pillars are formed on the first dielectric layer;

forming a first metal layer in contact with the connecting region and covering the first dielectric layer and the oxide pillars;

patterning the first metal using a via hole-forming mask, to form the metal wiring line and a plurality of metal pillars such that the metal wiring line is at a level higher than the levels of the metal pillars and at about the same level as a level of the oxide pillars;

forming a second dielectric layer covering the metal pillars and the oxide pillars and exposing the metal wiring line; and forming on the second dielectric layer a second metal layer that contacts the metal wiring line.

12. The method of fabricating a metal wiring line of integrated circuits as claimed in claim 11, further comprising the step of chemical mechanical polishing the first metal layer, after the step of forming the first metal layer but before the step of patterning the first metal layer.

13. A method of fabricating a metal wiring line of integrated circuits as claimed in claim 11, wherein the first metal layer is formed using sputtering.

14. A method of fabricating a metal wiring line of integrated circuits as claimed in claim 11, wherein the first dielectric layer includes TEOS.

15. A method of fabricating a metal wiring line of integrated circuits as claimed in claim 11, wherein the second dielectric layer is formed by plasma enhanced chemical vapor deposition.

16. A method of fabricating a metal wiring line of integrated circuits as claimed in claim 11, wherein the second dielectric layer includes TEOS.

* * * * *